(12) United States Patent
Etou et al.

(10) Patent No.: US 8,349,656 B2
(45) Date of Patent: Jan. 8, 2013

(54) MANUFACTURING METHOD OF LEADFRAME AND SEMICONDUCTOR DEVICE

(75) Inventors: Yusuke Etou, Kitakyusyu (JP); Naoki Fukami, Kitakyusyu (JP); Kiyoshi Matsunaga, Kitakyusyu (JP)

(73) Assignee: Mitsui High-Tec, Inc., Fukuoka (JP)

( * ) Notice: Subject to any disclaimer, the term of this patent is extended or adjusted under 35 U.S.C. 154(b) by 31 days.

(21) Appl. No.: 12/877,457

(22) Filed: Sep. 8, 2010

(65) Prior Publication Data
US 2011/0059577 A1   Mar. 10, 2011

(30) Foreign Application Priority Data
Sep. 9, 2009  (JP) ................................ 2009-207786

(51) Int. Cl.
*H01L 21/00* (2006.01)

(52) U.S. Cl. ................ 438/112; 257/E23.031

(58) Field of Classification Search .................. 438/112, 438/111, 123, 124; 257/666, E33.066, E23.031, 257/E21.705
See application file for complete search history.

(56) References Cited

U.S. PATENT DOCUMENTS

| 2002/0058412 A1* | 5/2002 | Ono et al. ..................... 438/678 |
| 2007/0181983 A1 | 8/2007 | Takai et al. |
| 2009/0224380 A1* | 9/2009 | Wang et al. ................... 257/670 |

FOREIGN PATENT DOCUMENTS

| JP | 2001-24135 | 1/2001 |
| JP | 2007-48981 | 2/2007 |

* cited by examiner

*Primary Examiner* — Shaun Campbell
(74) *Attorney, Agent, or Firm* — Greenblum & Bernstein P.L.C.

(57) ABSTRACT

In order to remove plating burrs generated in etching step, there is provided a manufacturing method of semiconductor devices on each of unit leadframes in a leadframe material in which a plurality of the unit leadframes are arranged in plural rows or a single row, wherein at least two types of plating burr removals are conducted after a half-etching is performed onto a front surface side of the leadframe material, using a first plating layer as resist film.

12 Claims, 8 Drawing Sheets

MANUFACTURING METHOD OF LEADFRAME AND SEMICONDUCTOR DEVICE

BACKGROUND OF THE INVENTION

1. Field of the Invention

This invention relates to a manufacturing method of leadframes and semiconductor devices.
a leadframe in which.

2. Related Art

There is known a conventional semiconductor device having a plurality of terminals with an area array shape that is formed by conducting etching process on a leadframe material 50 made of cupper or cupper alloy. As a manufacturing method of such semiconductor device, for example, the manufacturing method disclosed in JP 2001-24135A is known.

This manufacturing method is, as shown in FIGS. 7A to 7G, constituted by a plating layer formation step of forming plating layers on upper side terminal portions 60 (wire bonding portions 59) and an outer frame 53 surrounding the upper side terminal portions 60 on a front side of the leadframe material 50 as well as forming plating layers on lower side terminal portions 67 formed on a rear side of the leadframe material 50 corresponding to the upper side terminal portions 60 (external correction terminal portions); a first etching step of performing etching process onto the front side of the leadframe material 50 with a plating layer 57 as resist mask up to a predetermined depth so that a leadframe 70 is formed so as to protrude the outer frame 53 and the wire bonding portions 59; an assembling step of mounting a semiconductor element 64 on the leadframe 70 and connecting the semiconductor element 64 and the wire bonding portions 59 with bonding wires 65; a resin encapsulating step of encapsulating the front side of the leadframe 70 including the semiconductor element 64, bonding wire 65 and the protruded outer frame 53 with resin 66; a second etching step of performing etching process onto the rear side of the leadframe 70 with a plating layer 58 as resist mask formed thereon to separate the lower side terminal portions 67. First and second circuit patterns 55, 56 and an element mounting portion 61 are formed on the leadframe material 50.

However, in this manufacturing method, there is a problem that plating burrs 62,63 are generated due to erosion by etching solution at edges of the upper terminal portions 60 and the outer frame 53 that are protruded in the first etching step.

These plating burrs 62,63 could cause peeling of plating in later steps of manufacturing. Further, they could affect etching accuracy in later stages, resulting in a problem of decrease in reliability of the semiconductor devices such as causing a short circuit.

In JP 2007-48981A, water jet and ultrasonic wave are suggested as means for removing plating burrs generated in the above manufacturing method. When the water jet is used, the plating burrs in a half-etching area A in which terminals are formed in FIG. 8 are hit by the water jet with water pressure applied from the upper side as well as with the reflection of water pressure at side faces of the terminals, so that the plating burrs are removed. However, on the outer frame area B including the outer frame 53 and pilot holes 54, the reflection of the water jet applied from the upper side is hardly received, as a result, the plating burrs generated in the outer frame 53 and the pilot holes 54 to which the water pressure of the water jet is subjected cannot be removed sufficiently. Further, when the ultrasonic wave is used instead of the water jet, another problem could be caused that the leadframe is deformed because the strength is low in the half-etching area which is formed by reducing the thickness of the leadframe material by the etching conducted in the first etching step. Thus, any of these means for removing the plating burrs are not sufficient to remove the plating burrs reliably over the entire surface of the leadframe.

SUMMARY OF THE INVENTION

The present invention has been made in view of the above circumstances, and an object of the invention is to provide a manufacturing method of leadframes and semiconductor devices in which plating burrs generated in etching are removed.

A manufacturing method of leadframes according to a first aspect of the invention suitable to the above object is a manufacturing method of leadframes for manufacturing semiconductor devices by mounting a plurality of semiconductor elements individually on a plurality of unit leadframes which are arranged in plural rows or a single row in a leadframe material and encapsulating resin thereto, the manufacturing method comprising:

a first step of providing a first circuit pattern on a front surface of the unit leadframes for forming upper side terminal portions, upper faces of which serve wire bonding portions, and a second circuit pattern on a rear surface of the unit read frames, forming lower side terminal portions corresponding to the upper side terminal portions;

a second step of forming a first plating layer and a second plating layer on the front surface and the rear surface of the leadframe material, respectively, after the first step is performed to the leadframe material;

a third step of forming the upper side terminal portions by performing a half etching treatment onto the front surface of the leadframe, using the first plating layer as a resist film, wherein different types of plating burr removals are conducted onto an etched area on which the half etching treatment to form the upper side terminal portions is performed and onto an outer frame area on which pilot holes are provided so as to surround the unit lead frames in the leadframe material, to thereby remove plating burrs generated in the third step.

According to the first aspect of the invention, a plating burr removal suitable to the etched area on which the half etching is performed and a plating burr removal suitable to the outer frame area on which pilot holes are provided so as to surround the unit lead frames in the leadframe material can be separately selected by selecting the plating burr removal based on the shape and material of the leadframe. As a result, it is possible to remove the plating burrs efficiently and reliably while preventing deformation of the leadframes.

In the manufacturing method of leadframes according to the first aspect of the invention, it is preferable that the different types of plating burr removal include at least two processes of water jet, ultrasonic wave, laser, blasting and brushing.

According to the above construction, it is possible to remove the plating burrs reliably, and to remove effectively the plating burrs while preventing defects such as deformation of the leadframes.

In the manufacturing method of leadframes according to the first aspect of the invention, it is preferable that water jet plating burr removal is conducted to remove plating burrs generated in the etched area and ultrasonic wave plating burr removal is conducted to remove the plating burrs generated in the outer frame area on which the pilot holes are provided so as to surround the unit lead frames in the leadframe material.

According to the above construction, it is possible to prevent deformation of the thin etched area on which the half-etching is performed by conducting the water jet plating burr removal and it is possible to remove the plating burr reliably in the outer frame area and the pilot holes by conducting the ultrasonic wave plating burr removal.

In the manufacturing method of leadframes according to the first aspect of the invention, it is preferable that the etched area on which the half-etching is performed is protected by a protection member, when the plating burrs are removed in the outer frame area by the ultrasonic wave plating removal.

By applying ultrasonic waves in a state that the etched area is protected with the protection member, it is possible to prevent unfavorable deformation of the etched area due to cavitation generated in the washing liquid, and moreover, generation of the cavitation can be concentrated and amplified in vicinity of the outer frame. As a result, it is possible to remove the plating burrs reliably.

In the manufacturing method of leadframes according to the first aspect of the invention, it is preferable that a baffling member is disposed in a vicinity of at least one side face of the leadframe material to extend along a longitudinal direction of the of the leadframe material.

By providing the baffling members, generation of the cavitation can be concentrated and amplified more in the space between the baffling members, in other words, in the vicinity of the outer frame area when the ultrasonic waves are applied in the liquid water. As a result, it is possible to remove the plating burrs in the outer frame area more reliably and efficiently.

As the plating burrs are removed more reliably and efficiently, the step of removing the plating burrs can be conducted relatively in a short time. Further, by conducting the removal of the plating burrs reliably, occurrence of defects in the plating burr removal is suppressed.

A manufacturing method of semiconductor devices according to a second aspect of the invention is a manufacturing method of semiconductor devices on a leadframe material on which a plurality of unit leadframes are arranged in plural rows or a single row; the manufacturing method comprising:

a first step of providing a first circuit pattern on a front surface of the unit leadframes for forming upper side terminal portions, upper faces of which serve wire bonding portions, and a second circuit pattern on a rear surface of the unit read frames, forming lower side terminal portions corresponding to the upper side terminal portions;

a second step of forming a first plating layer and a second plating layer on the front surface and the rear surface of the leadframe material, respectively, after the first step is performed to the leadframe material;

a third step of providing the leadframes by forming the upper side terminal portions by performing a half etching treatment onto the front surface of the leadframe, using the first plating layer as a resist film;

a fourth step of mounting semiconductor elements on the front face of the leadframes such that the semiconductor elements are electrically connected with the leadframes by using boding wire and encapsulating resin;

a fifth step of separating the lower side terminal portions by performing a half etching treatment onto the rear surface of the leadframe, using the second plating layer as a resist film;

a sixth step of dividing the semiconductor devices formed in the leadframes into individual pieces, wherein different types of plating burr removals are conducted onto an etched area on which the half etching treatment to form the upper side terminal portions is performed and onto an outer frame area on which pilot holes are provided so as to surround the unit lead frames in the leadframe material, to thereby remove plating burrs generated in the third step.

According to the second aspect of the invention, a plating burr removal suitable to the etched area on which the half etching is performed and a plating burr removal suitable to the outer frame area on which the pilot holes are provided so as to surround the unit lead frames in the leadframe material can be separately selected by selecting the plating burr removal based on the shape and material of the leadframe. As a result, it is possible to remove the plating burrs efficiently and reliably while preventing deformation of the leadframes.

In the manufacturing method of semiconductor devices according to the second aspect of the invention, it is preferable that the different types of plating burr removal include at least two processes of water jet, ultrasonic wave, laser, blasting and brushing.

According to the above construction, it is possible to remove the plating burrs reliably, and to remove effectively the plating burrs while preventing defects such as deformation of the leadframe.

In the manufacturing method of semiconductor devices according to the second aspect of the invention, it is preferable that water jet plating burr removal is conducted to remove plating burrs generated in the etched area and ultrasonic wave plating burr removal is conducted to remove plating burrs generated in the outer frame area on which the pilot holes are provided so as to surround the unit lead frames in the leadframe material.

According to the above construction, it is possible to prevent deformation of the thin etched area on which the half-etching is performed by conducting the water jet plating burr removal and it is possible to remove the plating burr reliably in the outer frame area and the pilot holes by conducting the ultrasonic wave plating burr removal.

In the manufacturing method of semiconductor devices according to the second aspect of the invention, it is preferable that the etched area on which the half-etching is performed is protected by a protection member, when the plating burrs are removed in the outer frame area by the ultrasonic wave plating removal.

By applying ultrasonic waves in a state that the etched area is protected with the protection member, it is possible to prevent unfavorable deformation of the etched area due to cavitation generated in the washing liquid, and moreover, generation of the cavitation can be concentrated and amplified in vicinity of the outer frame. As a result, it is possible to remove the plating burrs reliably.

In the manufacturing method of semiconductor devices according to the second aspect of the invention, it is preferable that a baffling member is disposed in a vicinity of at least one side face of the leadframe material to extend along a longitudinal direction of the of the leadframe material.

By providing the baffling members, generation of the cavitation can be concentrated and amplified more in the space between the baffling members, in other words, in the vicinity of the outer frame area when the ultrasonic waves are applied in the liquid water. As a result, it is possible to remove the plating burrs in the outer frame area more reliably and efficiently.

As the plating burrs are removed more reliably and efficiently, the step of removing the plating burrs can be conducted relatively in a short time. Further, by conducting the removal of the plating burrs reliably, occurrence of defects in the plating burr removal is suppressed.

In the present invention, by changing the type of the burr removal conducted to the plating burrs generated when the etching is performed with the plating layer as the resist, corresponding to the areas of the leadframe, it is possible to remove the plating burrs reliably. As a result, it is possible to prevent defects due to remaining of the plating burrs such as peeling of plating, damage of the plating layer, decrease in the etching accuracy, short circuit etc. and to improve reliability of the semiconductor devices.

Further, by selecting the platting burr removal based on the shape and material of the leadframe, it is possible to remove the plating burrs reliably and to prevent defects such as deformation of the lead frame. As a result, occurrence of defects can be prevented.

DETAILED DESCRIPTION OF THE PREFERRED EMBODIMENTS

Embodiments of the invention will be described with reference to the drawings.

First Embodiment

Figure 2:
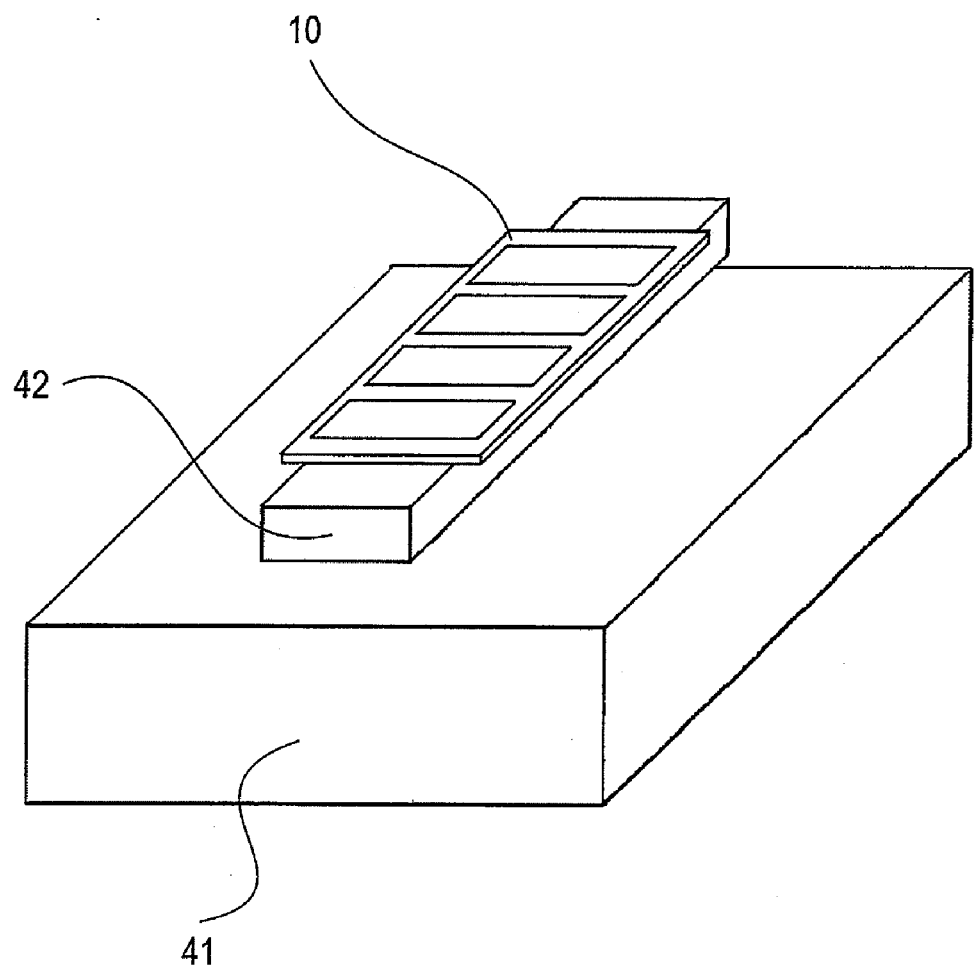
FIG. 2 is a perspective view showing a step of removing plating burrs by using ultrasonic waves according to the first embodiment.
Figure 3:
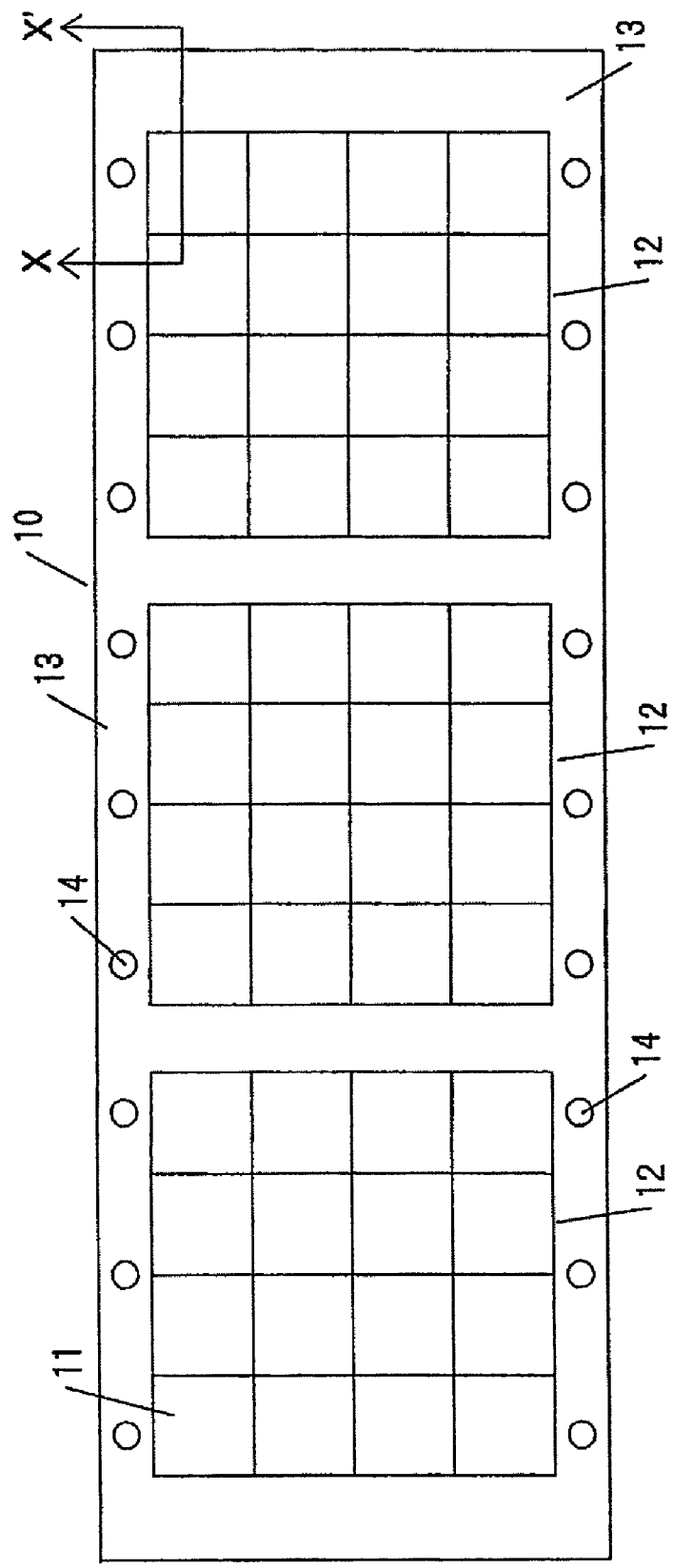
FIG. 3 is a plan view of a leadframe according to the first embodiment of the invention.
Figure 4:
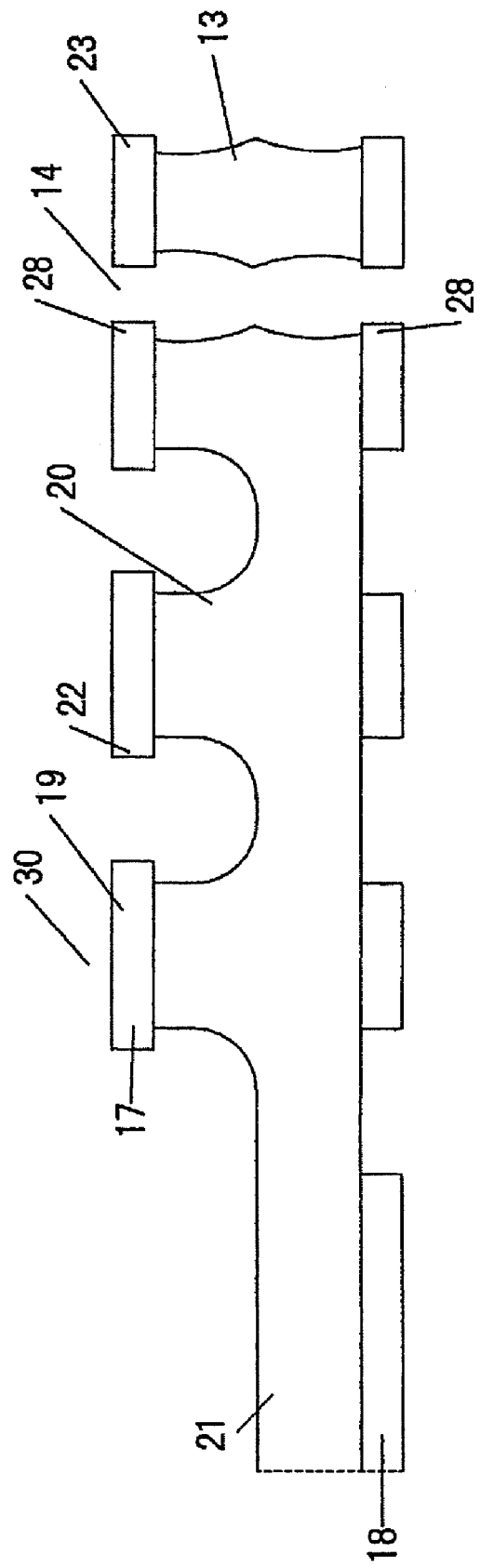
FIG. 4 is a cross-sectional view of the leadframe before plating burr removal according to the first embodiment of the invention.

FIGS. 1A to 1H are explanatory views of steps in a manufacturing method of semiconductor devices according to a first embodiment of the invention. FIG. 2 is a perspective view showing a step of removing plating burrs by using ultrasonic waves according to the first embodiment. FIG. 3 is a plan view of a leadframe according to the first embodiment of the invention. FIG. 4 is a cross-sectional view of the leadframe before plating burr removal according to the first embodiment of the invention.

Figure 1A:
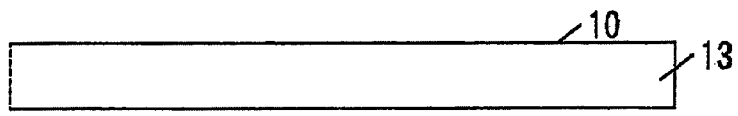
FIGS. 1A to 1H are explanatory views of steps in a manufacturing method of semiconductor devices according to an embodiment of the invention.

The step shown in FIG. 1A is a step of preparing a leadframe material. A leadframe material 10, which is referred to the area shown in the cross sectional view along the line X-X' in FIG. 3, is constituted by a material of cupper or cupper alloy (or iron-nickel alloy, aluminum, aluminum alloy etc.) having a predetermined area. In this first embodiment, a single or a plurality of frame batches 12 having a plurality of unit leadframes 11 and an outer frame 13 around the frame batches 12 are formed as shown in FIG. 3.

Figure 1B:
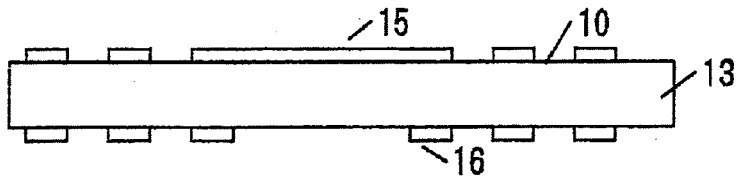

The step shown in FIG. 1B is a step of forming circuit patterns. There are formed with resist films an element mounting portion 21, an upper side terminal portion 20 which is arranged so as to surround the element mounting portion 21 and the upper surface of which forms a wire bonding portion 19, a first circuit pattern 15 forming the outer frame 13 on a front side of each unit leadframe 11, and a second circuit pattern 16 including lower side terminal portions 27 corresponding to the upper side terminal portions 20 on a rear side of each unit leadframe 11.

Figure 1C:
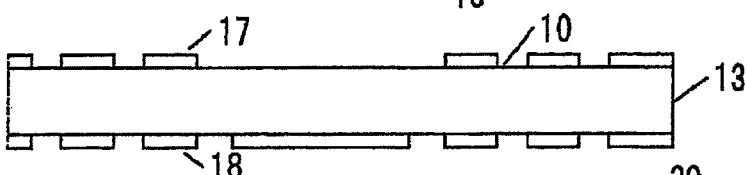

The step shown in FIG. 1C is a step of forming plating layers. On the front side and rear side of the leadframe material 10 on which the first and second circuit patterns 15, 16 are formed, a first plating layer 17 and a second plating layer 18 are formed, respectively. The first and second plating layers 17, 18 are formed for example by a palladium plating layer or gold plating layer formed on an undercoat nickel plating. Alternatively, the first and second plating layers may be formed with a tin plating layer, a tin plating layer formed on an undercoat nickel plating layer, or a plating layer made of combination of nickel, palladium, gold, silver, platinum etc.

After forming the plating layers, the resist films of the first and second circuit patterns 15, 16 are removed.

Figure 1D:
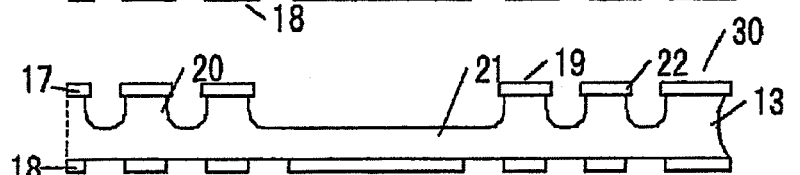

The step shown in FIG. 1D is a step of performing a half-etching on the upper side. The rear side of the leadframe material 10 is covered with an etching-resistant tape (not shown). A half-etching process is performed on the front side of the leadframe material 10 so as to remove up to 50-60% in thickness of the leadframe material 10, so that the element mounting portion 21 is formed, and the upper terminal portion 20 and the outer frame 13 are protruded. Thus, a leadframe 30 is formed.

As shown in FIG. 4, plating burrs 22 are generated around the wire bonding portions 19 of the leadframe 30 by the step shown in FIG. 1D. Plating burrs 23 are generated at edges of the outer frame 13 due to erosion by etching solution from a side face of the outer frame 13. Plating burrs 28 are generated in pilot holes 14, which are through holes.

Figure 1E:
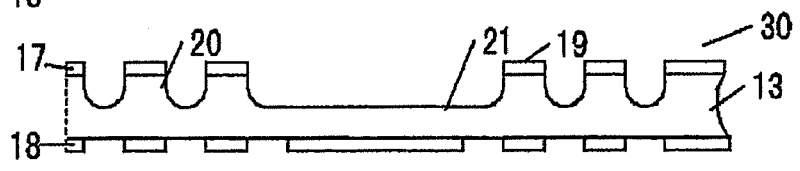

The step shown in FIG. 1E is a step of removing plating burrs. First, the plating burrs 23 on the outer frame 13 and the plating burrs 28 in the pilot holes 14 in the leadframe 30 shown in FIG. 3 are removed by applying ultrasonic waves to the areas where the plating burrs 23, 28 are formed to generate cavitation in the washing liquid. As shown in FIG. 2, the ultrasonic waves are applied in a state that the leadframe material 10 is disposed on a protection member 42 that is disposed on an ultrasonic oscillator 41 and that the set of these parts is embedded in the washing liquid. In this step, the etched area on which the half-etching is performed in the step shown in FIG. 1D is protected with the protection member 42 so as not to be exposed to the ultrasonic wave.

The protection member 42 is provided with a plate member constituted by lamination of a sponge layer (foaming material), glass fiber reinforced epoxy resin plate and rubber (NBR) in this embodiment. The material of the protection member 42 is not limited specifically to the above plate member but any other material can be used as long as it satisfies with the function of protecting the etched area of the leadframe material 10.

By conducting application of the ultrasonic waves in a state that the etched area is protected with the protection member 42, it is possible to prevent deformation of the etched area due to the cavitation generated in the washing liquid, and moreover, generation of the cavitation can be concentrated and amplified in vicinity of the outer frame 13.

Then, the plating burrs 22 generated around the wire bonding portions 19 are removed by using a water jet on the etched area on which the half-etching process is performed and which is located inside the frame batches 12 in FIG. 3. After that, the lead frame material 10 is washed with water in accordance with necessity.

As described above, as the water jet plating burr removal is conducted after the ultrasonic wave plating burr removal, the plating burrs removal by the water jet can also serve as a washing process. Therefore, it is possible to omit separate washing step after the plating burr removal.

Figure 5:
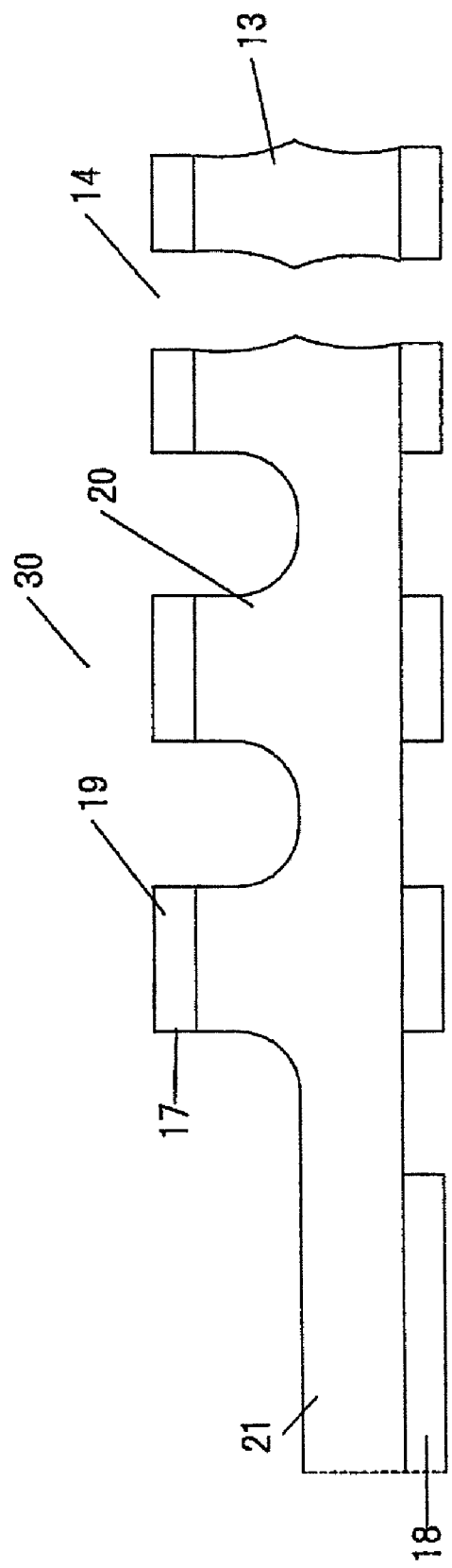
FIG. 5 is a cross-sectional view of the leadframe after plating burr removal according to the first embodiment of the invention.

The leadframe 30 after removing the plating burrs is shown in FIG. 5.

Figure 1F:
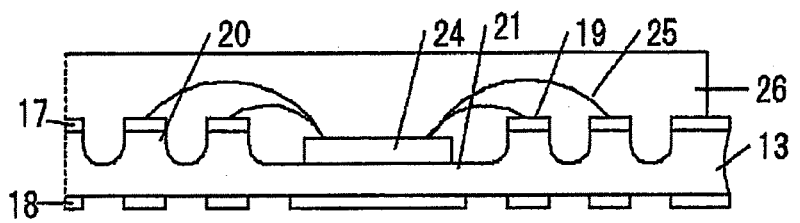

The step shown in FIG. 1F is a step of assembling. A semiconductor element 24 is mounted on the element mounting portion 21, and the semiconductor element 24 and the wire bonding portions 19 are electrically connected with bonding wires 25. After that, the semiconductor element 24, the wire bonding portions 19 and the bonding wires 25 are encapsulated with resin 26.

Figure 1G:
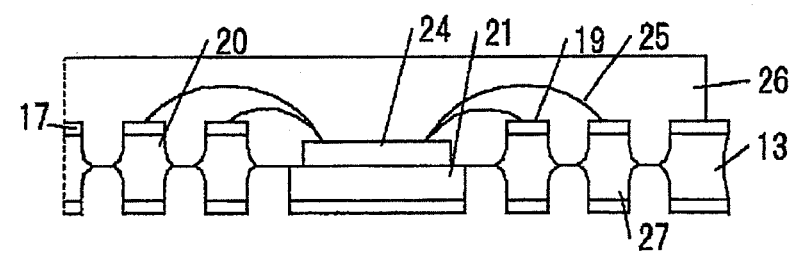

The step shown in FIG. 1G is a step of separating the lower side terminal portions. A half-etching is performed with the second plating layer 18 as the resist film, so that the lower side terminal portions 27 are separated individually. After that, the plating burrs formed on the lower side terminal portions 27 may be removed in accordance with necessity by conducting again the plating burr removals such as the water jet and the ultrasonic wave.

Figure 1H:
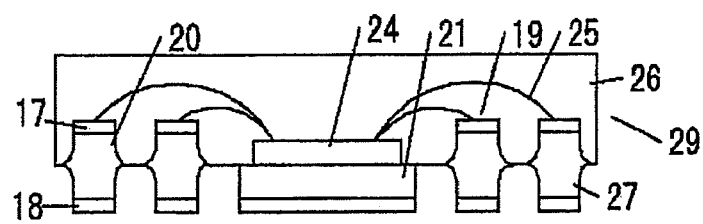

The step shown in FIG. 1H is a step of dividing into individual pieces. The unit leadframes 11 are divided into individual pieces from the frame batches 12 by means of a rotation blade (not shown) to thereby obtain semiconductor devices 29.

Second Embodiment

The manufacturing method of semiconductor devices according to the second embodiment is the method in which the step of removing burrs in the first embodiment shown in FIG. 2 is modified with the step as described below. The other steps in the second embodiment are identical to those in the first embodiment. Therefore, description is omitted for these steps.

Figure 6:
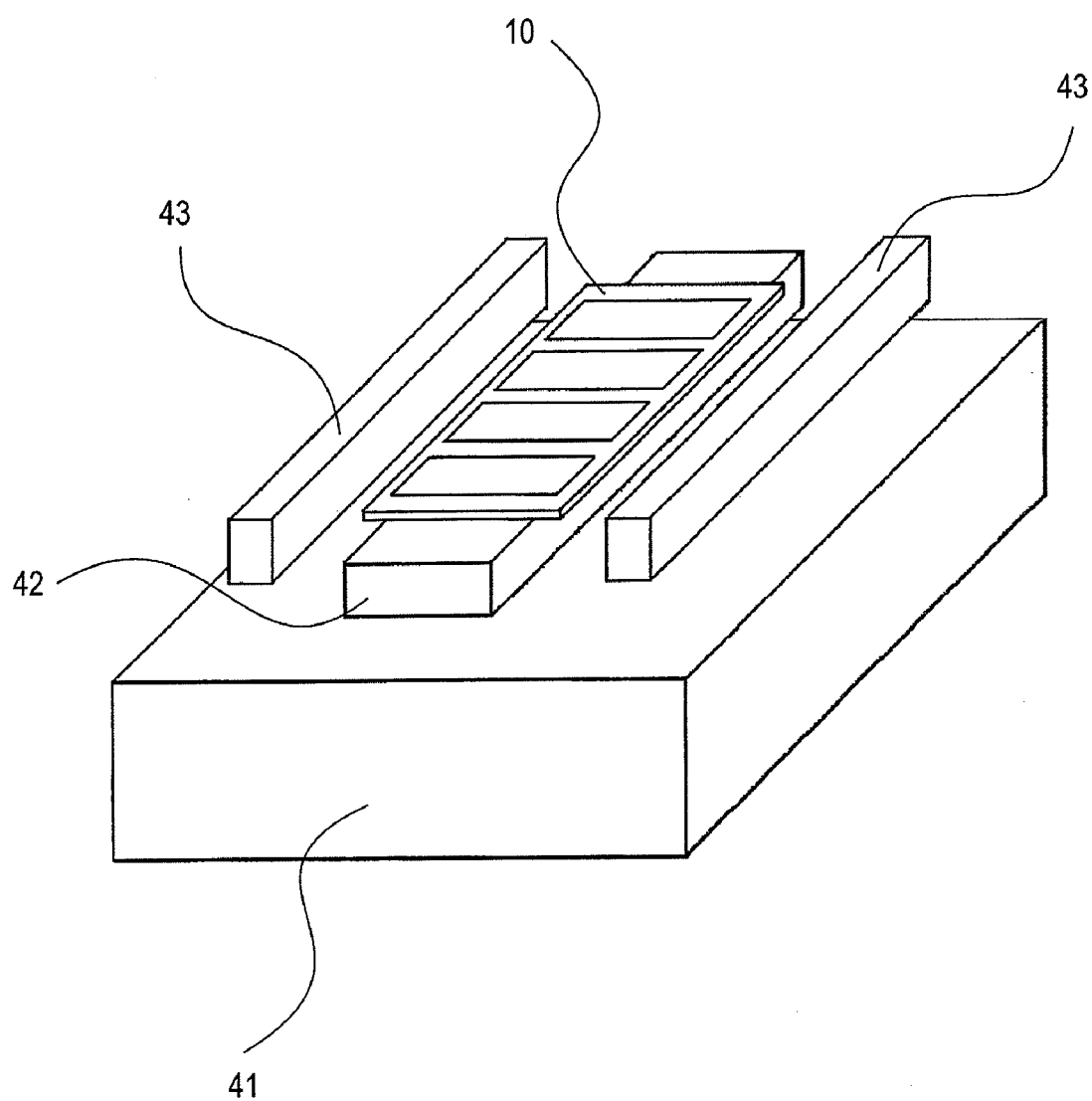
FIG. 6 is a perspective view showing a step of removing plating burrs by using ultrasonic waves according to the second embodiment.
Figure 7A:
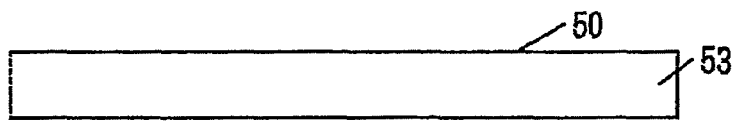
FIG. 7A to 7G are explanatory views of steps in a conventional manufacturing method of semiconductor devices.
Figure 7B:
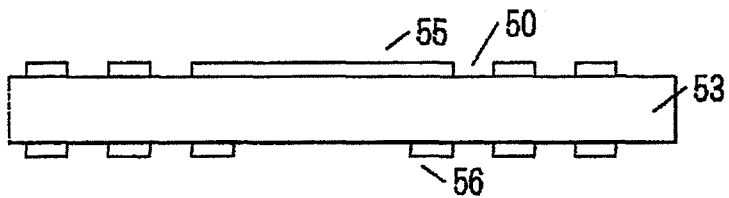
Figure 7C:
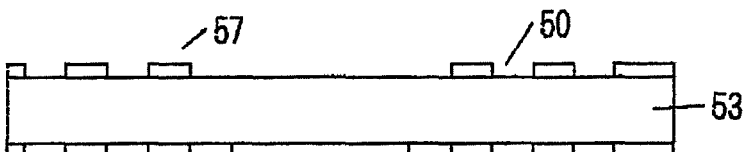
Figure 7D:
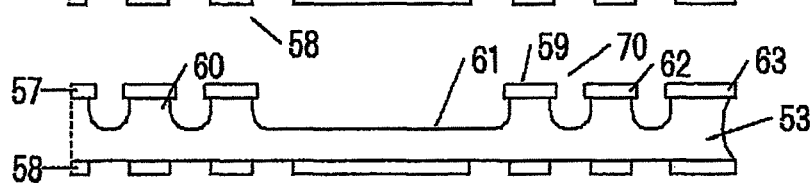
Figure 7E:
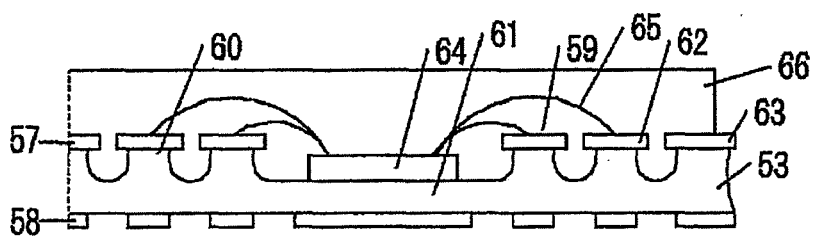
Figure 7F:
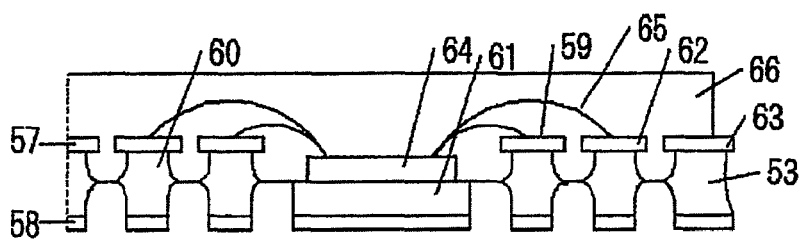
Figure 7G:
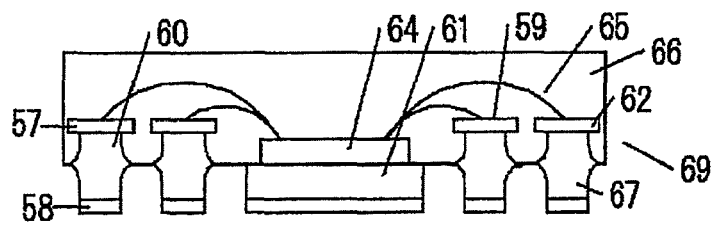
Figure 8:
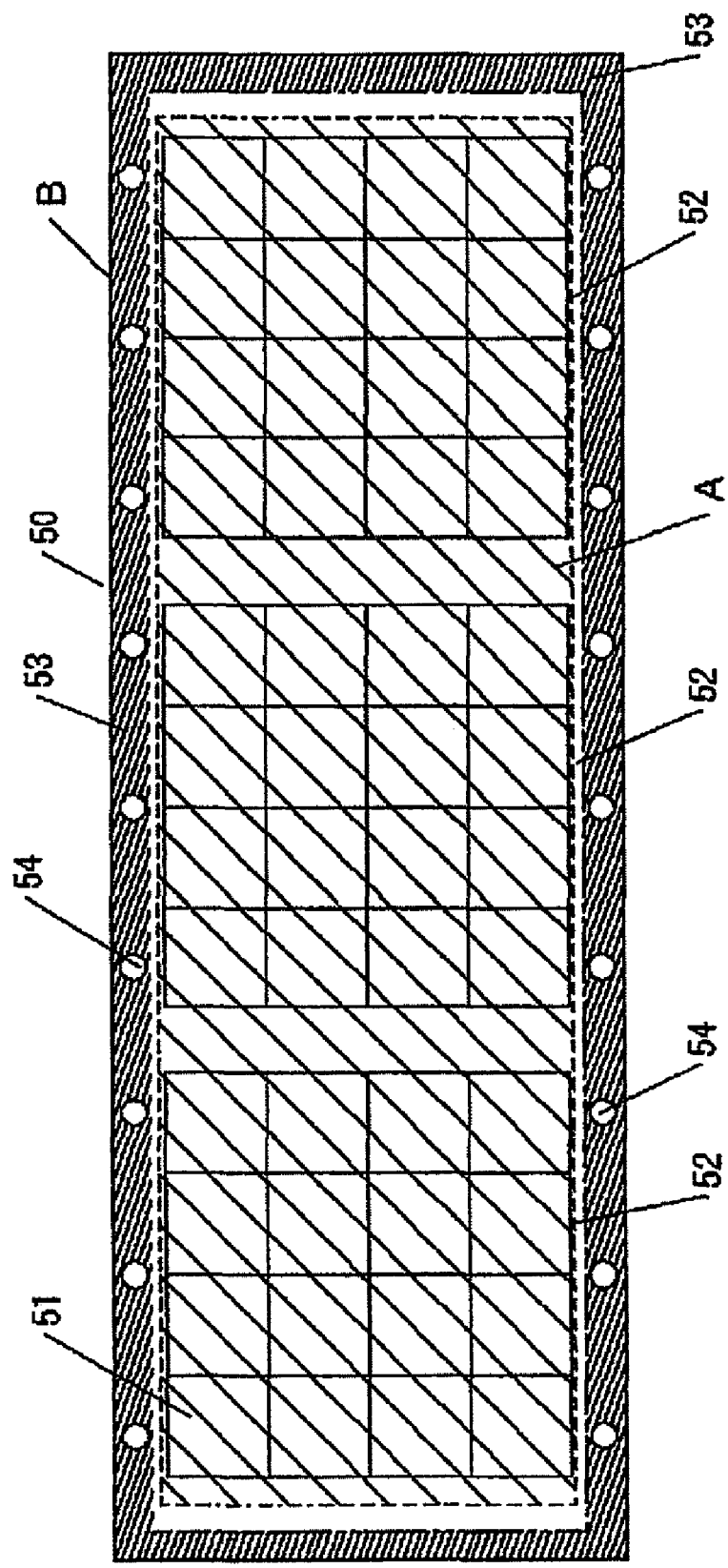
FIG. 8 is a plan view of a conventional leadframe.

FIG. 6 is a perspective view showing a step of removing plating burrs by using ultrasonic waves according to the second embodiment.

Similarly to the first embodiment, the step of removing burrs in the second embodiment is conducted as shown in FIG. 1E. The plating burrs 23 on the outer frame 13 and the plating burrs 28 in the pilot holes 14 in the leadframe 30 shown in FIG. 3 are removed by applying ultrasonic waves to the areas where the plating burrs 23, 28 are formed to generate cavitation in the washing liquid. As shown in FIG. 6, the leadframe material 10 is disposed on a protection member 42 that is disposed on an ultrasonic oscillator 41. In the second embodiment, a pair of baffling members 43 are disposed on the ultrasonic oscillator 41 in vicinity of side faces of the leadframe material 10 so as to extend along a longitudinal direction of the leadframe material 10, facing the opposite side faces. The ultrasonic waves are applied in a state that the set of these parts is embedded in the washing liquid.

Similarly to the first embodiment, the etched area of the leadframe material 10 is protected with the protection member 42 when the ultrasonic waves are applied, so that the etched area is not exposed to the ultrasonic waves.

In the second embodiment, by providing the baffling members 43, generation of the cavitation can be concentrated and amplified more than the first embodiment in the space between the baffling members 43, more specifically the areas between the baffling members and the protection member 42, in other words, in the vicinity of the outer frame 13 when the ultrasonic waves are applied in the liquid water. As a result, it is possible to remove the plating burrs 23,28 in the outer frame 13 and the pilot holes 14 more reliably and efficiently.

In the second embodiment, the baffling member used is a sponge material. However, the material of the baffling member is not limited to this type of material. For example, styrene foam, resin, plastic bags, metal members or the like may be also used as the baffling member.

Then, the plating burrs 22 generated around the wire bonding portions 19 are removed by using the water jet on the etched area on which the half-etching process is performed and which is located inside the frame batches 12 in FIG. 3. After that, the lead frame material 10 is washed with water in accordance with necessity.

As described above, as the water jet plating burr removal is conducted after the ultrasonic wave plating burr removal, the plating burrs removal by the water jet can also serve as a washing process. Therefore, it is possible to omit separate washing step after the plating burr removal.

The leadframe 30 after removing the plating burrs is shown in FIG. 5.

In the manufacturing method of semiconductor devices according to the second embodiment, in addition to the technical advantages obtained in the manufacturing method according to the first embodiment, it is possible to remove the plating burrs 23,28 in the outer frame 13 and the pilot holes 14 more reliably and efficiently. As a result, the step of removing the plating burrs can be conducted relatively in a short time. Further, by conducting the removal of the plating burrs reliably, occurrence of defects in the plating burr removal is suppressed.

The invention is not limited to the manufacturing method of semiconductor devices as described in the above first and second embodiments, and suitable improvements and modifications can be made as long as such modification does not change the substance of the invention.

In the step of removing the plating burrs as shown in FIG. 1E, the plating burrs 22 generated around the wire bonding portions 19 may be removed at first inside the frame batches 12 in FIG. 2 by the water jet, and then the plating burrs 23 in the outer frame 13 and the plating burrs 28 in the pilot holes 14 may be removed by the ultrasonic wave.

For example, in the embodiment, the step of thee burr removals is constituted by combination of the water jet and the ultrasonic wave. However, the burr removal is not limited to these two processes but, other burr removal processes such as laser process, blasting process or the like may be used in combination. Selection and order of such burr removal processes may be changed.

Further, in the second embodiment, the pair of the baffling members 43 are disposed in vicinity of both side faces of the leadframe material 10. However, only one of the baffling member 43 without forming such pair can also create similar technical advantage to concentrate and amplify generation of the cavitation at the one side face of the leadframe material 10 which the baffling member 43 faces.

What is claimed is:

1. A manufacturing method of leadframes used for manufacturing semiconductor devices by mounting a plurality of semiconductor elements individually on a plurality of unit leadframes which are arranged in plural rows or a single row in a leadframe material and encapsulating resin thereto, the manufacturing method comprising:

providing, with resist films, a first circuit pattern on a front surface of the unit leadframes for forming upper side terminal portions, upper faces of which serve wire bonding portions, and a second circuit pattern on a rear surface of the unit leadframes, forming lower side terminal portions corresponding to the upper side terminal portions;

forming a first plating layer and a second plating layer on the front surface and the rear surface of the leadframe material, respectively, after the circuit pattern providing is performed to the leadframe material, and removing the resist films;

forming the upper side terminal portions by performing a half-etching treatment onto the front surface of the leadframe, using the first plating layer directly as a resist film without further providing another resist film, wherein a first plating burr removal that excludes ultrasonic wave plating burr removal is conducted at least at an etched area to remove plating burrs generated in an etched area on which the half-etching treatment to form the upper side terminal portions is performed by using the first plating layer directly as the resist film, and a second plating burr removal that includes ultrasonic wave plating burr removal is conducted only at an outer frame area to remove plating burrs generated in the outer frame area on which pilot holes are provided so as to surround the unit leadframes in the leadframe material, to thereby remove plating burrs generated in the upper side terminal portions forming.

2. A manufacturing method of leadframes according to claim 1, wherein the etched area on which the half-etching is performed is protected by a protection member, when the plating burrs are removed in the outer frame area by the ultrasonic wave plating removal.

3. A manufacturing method of leadframes according to claim 1, wherein a baffling member is disposed in a vicinity of at least one side face of the leadframe material to extend along a longitudinal direction of the leadframe material.

4. A manufacturing method of semiconductor devices on a leadframe material on which a plurality of unit leadframes are arranged in plural rows or a single row; the manufacturing method comprising:

providing, with resist films, a first circuit pattern on a front surface of the unit leadframes for forming upper side terminal portions, upper faces of which serve wire bonding portions, and a second circuit pattern on a rear surface of the unit leadframes, forming lower side terminal portions corresponding to the upper side terminal portions;

forming a first plating layer and a second plating layer on the front surface and the rear surface of the leadframe material, respectively, after the circuit pattern providing is performed to the leadframe material, and removing the resist films;

providing the leadframes by forming the upper side terminal portions by performing a half-etching treatment onto the front surface of the leadframe, using the first plating layer directly as another resist film without further providing a resist film;

mounting semiconductor elements on the front face of the leadframes such that the semiconductor elements are electrically connected with the leadframes by using bonding wire and encapsulating resin;

separating the lower side terminal portions by performing a half-etching treatment onto the rear surface of the leadframe, using the second plating layer as a resist film;

dividing the semiconductor devices formed in the leadframes into individual pieces, wherein a first plating burr removal that excludes ultrasonic wave plating burr removal is conducted at least at an etched area to remove plating burrs generated in an etched area on which the half-etching treatment to form the upper side terminal portions is performed by using the first plating layer directly as the resist film, and a second plating burr removal that includes ultrasonic wave plating burr removal is conducted to remove plating burrs generated in the outer frame area on which pilot holes are provided so as to surround the unit leadframes in the leadframe material, to thereby remove plating burrs generated in the leadframe providing.

5. A manufacturing method of semiconductor devices according to claim 4, wherein the etched area on which the half-etching to form the upper side terminal portions is performed is protected by a protection member, when the plating burrs are removed in the outer frame area by the ultrasonic wave plating removal.

6. A manufacturing method of semiconductor devices according to claim 4, wherein a baffling member is disposed in a vicinity of at least one side face of the leadframe material to extend along a longitudinal direction of the leadframe material.

7. A manufacturing method of leadframes used for manufacturing semiconductor devices by mounting a plurality of semiconductor elements individually on a plurality of unit leadframes which are arranged in plural rows or a single row in a leadframe material and encapsulating resin thereto, the manufacturing method comprising:

a first step of providing a first circuit pattern on a front surface of the unit leadframes for forming upper side terminal portions, upper faces of which serve wire bonding portions, and a second circuit pattern on a rear surface of the unit leadframes, forming lower side terminal portions corresponding to the upper side terminal portions;

a second step of forming a first plating layer and a second plating layer on the front surface and the rear surface of the leadframe material, respectively, after the first step is performed to the leadframe material;

a third step of forming the upper side terminal portions by performing a half-etching treatment onto the front surface of the leadframe, using the first plating layer directly as a resist film, wherein different types of plating burr removals are conducted onto an etched area on which the half-etching treatment to form the upper side terminal portions is performed and onto an outer frame area on which pilot holes are provided so as to surround the unit leadframes in the leadframe material, to thereby remove plating burrs generated in the third step, the plating burr removal including providing a protection member positioned on an oscillator on which the leadframe material is positioned to protect the half-etching area during burr removal.

8. A manufacturing method of semiconductor devices on a leadframe material on which a plurality of unit leadframes are arranged in plural rows or a single row; the manufacturing method comprising:

a first step of providing a first circuit pattern on a front surface of the unit leadframes for forming upper side terminal portions, upper faces of which serve wire bonding portions, and a second circuit pattern on a rear surface of the unit leadframes, forming lower side terminal portions corresponding to the upper side terminal portions;

a second step of forming a first plating layer and a second plating layer on the front surface and the rear surface of the leadframe material, respectively, after the first step is performed to the leadframe material;

a third step of providing the leadframes by forming the upper side terminal portions by performing a half-etching treatment onto the front surface of the leadframe, using the first plating layer as a resist film;

a fourth step of mounting semiconductor elements on the front face of the leadframes such that the semiconductor elements are electrically connected with the leadframes by using bonding wire and encapsulating resin;

a fifth step of separating the lower side terminal portions by performing a half-etching treatment onto the rear surface of the leadframe, using the second plating layer as a resist film;

a sixth step of dividing the semiconductor devices formed in the leadframes into individual pieces, wherein different types of plating burr removals are conducted onto an etched area on which the half-etching treatment to form the upper side terminal portions is performed and onto an outer frame area on which pilot holes are provided so as to surround the unit leadframes in the leadframe material, to thereby remove plating burrs generated in the third step, the plating burr removal including providing a protection member positioned on an oscillator on which the leadframe material is positioned to protect the half-etching area during burr removal.

9. A manufacturing method of leadframes according to claim 1, wherein the first plating burr removal includes water jet plating burr removal.

10. A manufacturing method of leadframes according to claim 1, wherein the first plating burr removal is conducted only at the etched area.

11. A manufacturing method of semiconductor devices according to claim 4, wherein the first plating burr removal includes water jet plating burr removal.

12. A manufacturing method of semiconductor devices according to claim 4, wherein the first plating burr removal is conducted only at the etched area.

* * * * *

UNITED STATES PATENT AND TRADEMARK OFFICE
CERTIFICATE OF CORRECTION

PATENT NO. : 8,349,656 B2
APPLICATION NO. : 12/877457
DATED : January 8, 2013
INVENTOR(S) : Yusuke Etou et al.

Page 1 of 1

It is certified that error appears in the above-identified patent and that said Letters Patent is hereby corrected as shown below:

In the Claims

At column 9, line 55 (claim 6, line 20) of the printed patent, please change "another" to --a-- after as.

At column 9, line 56 (claim 6, line 20) of the printed patent, please change "a" to --another-- after providing.

Signed and Sealed this
Sixth Day of August, 2013

Teresa Stanek Rea
*Acting Director of the United States Patent and Trademark Office*